US 6,727,174 B1

(12) United States Patent
Kotecki et al.

(10) Patent No.: US 6,727,174 B1
(45) Date of Patent: Apr. 27, 2004

(54) METHOD FOR FABRICATING A DUAL-DIAMETER ELECTRICAL CONDUCTOR

(75) Inventors: David Edward Kotecki, Hopewell Junction, NY (US); Katherine Lynn Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 09/643,372

(22) Filed: Aug. 22, 2000

Related U.S. Application Data

(62) Division of application No. 09/037,849, filed on Mar. 10, 1998.

(51) Int. Cl.$^7$ .......................................... H01L 21/4763
(52) U.S. Cl. ...................................... 438/638; 257/775
(58) Field of Search ........................... 252/775; 438/638

(56) References Cited

U.S. PATENT DOCUMENTS

| | | | |
|---|---|---|---|
| 5,252,517 A | 10/1993 | Blalock et al. | |
| 5,471,094 A | 11/1995 | Lien | |
| 5,539,247 A | 7/1996 | Cheung et al. | |
| 5,585,300 A | 12/1996 | Summerfelt | |
| 5,701,029 A | 12/1997 | Sasaki | |
| 5,847,460 A | * 12/1998 | Liou et al. | 257/635 |
| 5,899,716 A | * 5/1999 | Tseng | 438/254 |
| 5,915,203 A | 6/1999 | Sengupta et al. | |
| 6,054,377 A | 4/2000 | Filipiak et al. | |

* cited by examiner

Primary Examiner—Long Pham
Assistant Examiner—Howard Weiss
(74) Attorney, Agent, or Firm—Robert M. Trepp; Randy W. Tung

(57) ABSTRACT

The present invention discloses a multi-diameter electrical conductor for use as an embedded plug in a microelectronic device. The multi-diameter electrical conductor consists of a body portion which has a first diameter, and at least one neck portion in contact with the body portion that has at least a second diameter smaller than the first diameter. In a preferred embodiment, the multi-diameter conductor is a dual-diameter conductor providing electrical communication between an electrode and an active circuit element in a semiconductor structure and comprising a lower body portion and an upper neck portion. The conductive materials used in forming the body portion and the neck portion of the contact plug can be selected from doped polysilicon, refractory metals, metal silicides, low resistivity metals, noble metals and their alloys, adhesion layers, metallic diffusion barrier layers, and oxide and nitride diffusion barrier materials. In a preferred embodiment, the body portion is formed of a first conductive material while the neck portion is formed of a second conductive material. In an alternate embodiment, the body portion and the neck portion are formed of the same conductive material. In another alternate embodiment, the contact plug further includes an additional layer of a conductive material situated between the body portion and the neck portion formed of a material different than that used in forming the body portion and the neck portion. The additional layer of conductive material has a diameter not less than the diameter of the neck portion and not more than the diameter of the body portion.

12 Claims, 3 Drawing Sheets

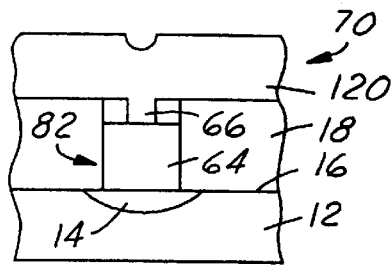
FIG.6A
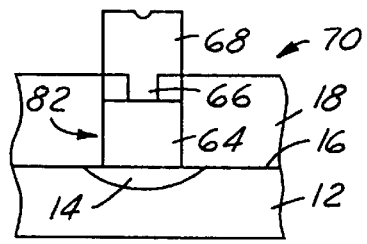
FIG.6B
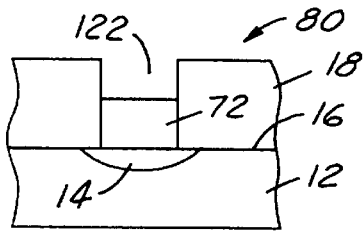
FIG.7A
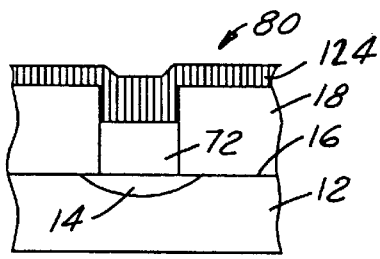
FIG.7B
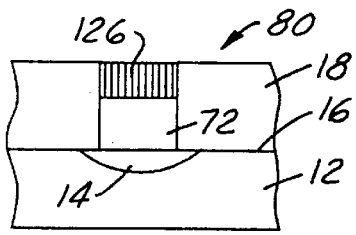
FIG.7C
FIG.7D
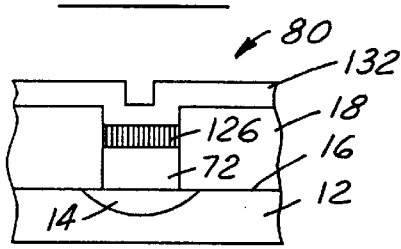
FIG.7E
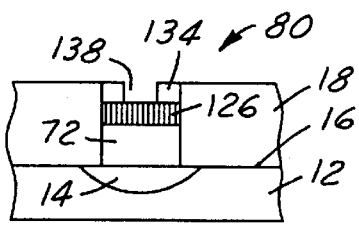
FIG.7F
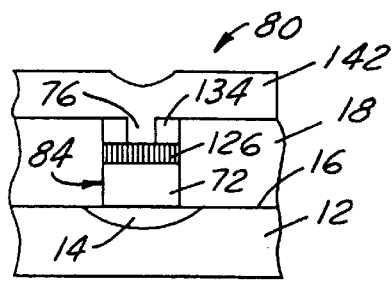
FIG.7G
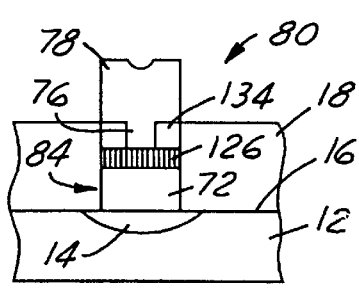
FIG.7H

METHOD FOR FABRICATING A DUAL-DIAMETER ELECTRICAL CONDUCTOR

This is a divisional of copending application Ser. No. 09/037,849 filed on Mar. 10, 1998.

FIELD OF THE INVENTION

The present invention generally relates to a dual-diameter electrical conductor for use as an embedded plug in a microelectronic device, and to a method for fabricating such a conductor, and more particularly relates to a dual-diameter electrical conductor consisting of a lower body portion and an upper neck portion wherein the neck portion is fabricated with a diameter smaller than the lithographically defined diameter of the body portion, and to a method for fabricating such an electrical conductor by building insulating sidewall spacers to define the neck portion of the conductor. The use of this dual-diameter plug geometer provides a misalignment tolerance wherein the body portion of the plug is protected from exposure to subsequently deposited materials and process ambients when only the neck portion of the plug is completely overlapped by a subsequentially deposited conductor.

BACKGROUND OF THE INVENTION

In modem microelectronic devices, dynamic random access memory (DRAM) devices have been widely used for fast and temporary data storage. In DRAM devices, small dimensions and high capacitance value per unit area of the capacitor memory cell are desirable characteristics for achieving a high storage density. A DRAM device is termed dynamic because the cells retain information only for a limited period of time and must be read and refreshed periodically, in contrast to a static random access memory (SRAM) cell which does not require periodic refresh signals in order to retain stored data.

A typical DRAM cell is formed by a field effect transistor and a storage capacitor. When DRAM cells were first developed, large footprint planar type storage capacitors were utilized. As the dimensions of modem memory devices continue to shrink, other capacitor designs with reduced chip real estate usage such as the stacked capacitor became important. In a stacked capacitor, the capacitor is generally formed vertically under a bit line on the surface of a silicon substrate. For a given capacitor footprint, storage capacitor area, and thus capacitance, can be increased by increasing the capacitor height. A stacked capacitor can be formed by a layer of a dielectric material such as silicon dioxide or oxide-nitride-oxide sandwiched between two layers of doped polysilicon.

Stacked capacitors for DRAMS are also built on substrates that contain embedded contact vias which are filled with a conductive plug material. The conductive plug connects a conductive element in the underlying substrate to an overlying bottom or stacked electrode. The conductive plug typically has a diameter that is equal to the minimum lithographic dimension. In the fabrication process for the stacked capacitor, a small amount of misalignment between the conductive plug and the stacked electrode can be tolerated. However, problems are encountered when the electrode fails to completely cover the plug. The problems caused by the misalignment are particularly serious for capacitors incorporating noble metal electrodes and high epsilon dielectrics. For example, the exposed plug material may oxidize during a subsequent dielectric material deposition process, to produce an insulating material or undesirable volume-change-induced stresses.

Alternatively, exposed plug material may also react with the subsequently deposited high epsilon dielectric, or produce a high-leakage path over the areas where the plug and high epsilon dielectric are in contact. Another consideration related to misalignment tolerance is the critical need to avoid the situation where a single electrode contacts two plugs. This can occur when a severe misalignment is coupled with an etch bias sufficient to enlarge the plug dimensions to the point that the separation between the edges of two adjacent plugs is smaller than the electrode diameter. This etch bias can be corrected by utilizing sidewall spacers inside the contact via hole.

A conventional capacitor electrode/contact plug structure is shown in FIG. 1. The microelectronic structure 10 is built on a silicon substrate 12 which has an active circuit element 14 formed in its top surface 16. On the top surface 16 of the substrate 12, a dielectric material layer 18 is first deposited and then a contact hole 22 is formed therein. Into the contact hole 22, either one or two conductive materials, such as conductive material 24 and 26 shown in FIG. 1, can be deposited and etched to form the contact plug 28. In a process where a stacked capacitor is to be formed, a layer of electrode material is then deposited on top of the dielectric layer 18 and the contact plug 28 and then formed into a conductive electrode 30. The conductive electrode 30 is formed by a standard lithographic method which typically has a minimum lithography dimension similar to the diameter of the contact plug 28. Due to an inevitable misalignment occurring in the lithography process, the electrode 30 overlaps the contact plug 28 on only about two thirds of its top surface and thus leaves about one third of its top surface uncovered or exposed. In a subsequent dielectric deposition process for forming the capacitor dielectric layer wherein high temperature is normally required, the uncovered surface area 32 of the contact plug 28 oxidizes and may become insulating. This provides an undesirable process element for the dielectric layer forma.

As device dimensions continue to shrink in large memory arrays, the spacings between adjacent plug/stacked electrode structures become closer together and as a consequence, the tolerance for misalignment between the plug and the stacked electrode lithography levels decreases. Reducing the required margin for misalignment tolerance (and thus the minimum required electrode diameter) would allow more space between electrodes having the-same center-to-center spacing. The extra spacing achieved can be used to better accommodate the dielectric and counter electrode layers which are subsequently deposited for the capacitor that must fit between adjacent electrodes. Alternatively, reducing the minimum required electrode diameter would allow smaller footprint capacitors with the smaller center-to-center spacing expected to be necessary for the reduced wiring dimensions and cell sizes in larger than 4 gigabit DRAM. One way to achieve a reduced minimum electrode diameter is to utilize sidewall spacers inside a contact via hole.

Insulating sidewall spacers have been used in semiconductor structures, however, they are typically formed on the outer surfaces of structures, e.g., as sidewall coatings on gates in MOS devices for preventing shorting between silicon or silicided source and drain regions. Sidewall spacer coatings that are formed on the inside cavities have also been reported by others. For instance, U.S. Pat. No. 5,442,213 discloses a semiconductor device that has a high dielectric capacitor with sidewall spacers. A cavity embedded in a layer of a first dielectric material is initially provided with dielectric sidewalls and a conductive base. Sidewall spacers of a second dielectric material are then deposited to line the cavity's original dielectric sidewalls. The spacers deposited are tapered such that they are thicker at the bottom and thinner at the top of the cavity. The objective for the sidewall spacers is to make it easier for the barrier and bottom electrode layers of the capacitor to be deposited on the substrate without leaving voids in the cavity.

U.S. Pat. No. 5,252,517 also discloses a method for isolating a conductive contact plug in a cavity from conductive elements that are embedded in the dielectric sidewalls of the cavity by lining the cavity with insulating sidewall spacers. The problem of misalignment tolerance is discussed in U.S. Pat. No. 5,471,094 which discloses a self-aligned via structure in which conductive plugs are embedded in a dielectric layer overlying a blanket metal layer M1. The M1 metal layer is then patterned by etching through the dielectric/M1 stack to produce a compound plug structure including the original plug material (in areas where the misaligned M1 via pattern mask overlapped with the original plug) and the dielectric material (in areas where the misaligned M1 via pattern mask overlapped with the dielectric material). However, none of these patents address the improvement of contact plugs by utilization of a dual diameter geometry wherein the misalignment-intolerant features may be reduced to sub-minimum lithography dimensions.

It is therefore an object of the present invention to produce a multi-diameter electrical conductor in a microelectronic structure that does not have the drawbacks and shortcomings of the conventional conductors fabricated in microelectronic structures.

It is another object of the present invention to provide a multi-diameter electrical conductor in a microelectronic structure that consists of a body portion that has a larger diameter and at least one neck portion that has a smaller diameter.

It is a further object of the present invention to provide a multi-diameter electrical conductor for use in a microelectronic structure that has a neck portion of the conductor formed in sub-minimum lithography dimensions defined by sidewall spacers.

It is another further object of the present invention to provide a method for forming a dual-diameter electrical conductor for use in a microelectronic structure that consists of a body portion that has a larger diameter and a neck portion that has a smaller diameter.

It is still another object of the present invention to provide a dual-diameter electrical conductor for use in a microelectronic structure which consists of a body portion that has a larger diameter formed integral with and substantially overlapping a neck portion that has a smaller diameter.

It is yet another object of the present invention to provide a dual-diameter electrical conductor for use in a microelectronic structure for connecting stacked capacitor electrodes and underlying circuit elements in semiconductor devices.

It is still another further object of the present invention to provide a method for forming a dual-diameter electrical conductor in a semiconductor device by first forming a body portion that has a larger diameter and then forming sidewall spacers in a contact hole such that a neck portion of a smaller diameter can be formed.

It is yet another further object of the present invention to provide a method for forming a dual-diameter electrical conductor for use in a semiconductor device by forming a body portion that has a larger diameter with a first conductive material unitarily with a neck portion that has a smaller diameter formed of a second conductive material that is substantially the same or different as the first conductive material.

SUMMARY OF THE INVENTION

In accordance with the present invention, a dual-diameter electrical conductor for use in a microelectronic structure and a method for its fabrication are provided.

In a preferred embodiment, a multi-diameter electrical conductor is provided which includes a body portion that has a first diameter, and at least one neck portion in contact with the body portion that has at least a second diameter smaller than the first diameter. The conductor may be fabricated with the body portion formed of a first conductive material and the at least one neck portion formed of a second conductive material. The electrical conductor may further be provided with an additional layer of a conductive material sandwiched between the body portion and the at least one neck portion, wherein the additional layer of conductive material is formed of a material different than that used in forming the body portion and the at least one neck portion. The additional layer of conductive material may have a diameter not less than the diameter of the neck portion and not more than the diameter of the body portion. The conductive material used in forming the body portion and the neck portion can be at least one member selected from doped polysilicon, refractory metals, metal silicides, low resistivity metals, noble metals and their alloys, metallic diffusion barrier materials, and oxide and nitride diffusion barrier materials. The low resistivity metals include Al, Al—Cu, Cu and Cu alloys, the metallic diffusion barrier materials include refractory metals, while the oxide, nitride and suicide diffusion barrier materials include TiN, TaSiN, TiAlN, WN, TaN and WSi. The electrical conductor formed can be advantageously used in a semiconductor device to provide electrical communication between an overlying electrode and an underlying circuit element. By utilizing the present invention novel method, the first diameter of the body portion can be substantially equal to a minimum lithographic dimension, while the second diameter of the neck portion can be less than the minimum lithographic dimension.

In another preferred embodiment, a dual-diameter electrical conductor is provided which includes a body portion that has a first diameter, and a neck portion in contact with the body portion that has a second diameter smaller than the first diameter. The body portion of the dual-diameter conductor substantially or completely overlaps the neck portion. The electrical conductor provides electrical communication between an electrode and a circuit element in a semiconductor device.

In another preferred embodiment, a microelectronic device that is fabricated with a dual-diameter electrical conductor therein is provided. The dual-diameter electrical conductor is constructed by a body portion that has a first diameter, and a neck portion in contact with the body portion that has a second diameter smaller than the first diameter.

In still another preferred embodiment, a dynamic random access memory device that is fabricated with a dual-diameter electrical conductor therein is provided. The dual-diameter electrical conductor in the DRAM device is constructed with a body portion that has a first diameter, and a neck portion in contact with the body portion that has a second diameter smaller than the first diameter. The memory device has at least one of its capacitor electrodes in electrical communication with the neck portion of the dual-diameter electrical conductor.

The present invention is further directed to a method for fabricating a dual-diameter electrical conductor that can be carried out by the operating steps of first providing a substrate that has a first conductive region, then depositing a layer of a first dielectric material on the substrate, then etching a first opening in the first dielectric material layer to expose the first conductive region in the substrate, then depositing a second conductive material into the first opening in the first dielectric material layer to form a body portion of the conductor, then removing a surface layer of the second conductive material to at least partially expose an upper sidewall surface in the first opening, then forming sidewall spacers of a second dielectric material on the upper sidewall surface of the first opening thereby defining a second opening through which the body portion of the conductor is exposed, and depositing a third conductive material into the second opening and forming a neck portion of the conductor that is in contact with the body portion of the conductor. The first opening in the first dielectric material layer can be advantageously formed by a reactive ion etching method. The first opening formed can be a contact hole that at least partially exposes the first conductive region in the substrate. The method may further include the steps of depositing and forming a stacked capacitor electrode on top of and in electrical communication with the neck portion of the electrical conductor. The sidewall spacers of the second dielectric material can be advantageously formed by a conformal deposition technique followed by an anisotropic etching process. The second opening defined by the sidewall spacers formed in the first opening is smaller than the first opening, thus allowing the formation of a neck portion of the electrical conductor having a diameter smaller than that of the body portion of the conductor.

BRIEF DESCRIPTION OF THE DRAWINGS

These and other objects, features and advantages of the present invention will become apparent from the following detailed description and the appended drawings in which:

FIG. 6A is an enlarged, cross-sectional view of the present invention alternate embodiment contact plug having a second conductive layer deposited into an opening formed by the sidewall spacers.

FIG. 6B is an enlarged, cross-sectional view of the present invention alternate embodiment contact plug structure of FIG. 6A having the capacitor electrode formed in contact with the neck portion of the contact plug.

FIG. 7A is an enlarged, cross-sectional view of the present invention second alternate embodiment contact plug structure showing a body portion of a contact plug is formed.

FIG. 7B is an enlarged, cross-sectional view of the present invention second alternate embodiment contact plug of FIG. 7A having an additional conductive material layer deposited on top filing the recess.

FIG. 7C is an enlarged, cross-sectional view of the present invention second alternate embodiment of FIG. 7B having the additional conductive material layer planarized.

FIG. 7D is an enlarged, cross-sectional view of the present invention second alternate embodiment of FIG. 7C having the additional conductive material layer formed by a selective etching process.

FIG. 7E is an enlarged, cross-sectional view of the present invention second alternate embodiment of FIG. 7D having a second dielectric material deposited into the recess in the contact hole.

FIG. 7F is an enlarged, cross-sectional view of the present invention second alternate embodiment of FIG. 7E having the sidewall spacers formed from the second dielectric material.

FIG. 7G is an enlarged, cross-sectional view of the present invention second alternate embodiment contact plug structure of FIG. 7F having a second conductive material layer deposited into the recess formed by the sidewall spacers.

FIG. 7H is an enlarged, cross-sectional view of the present invention second alternate embodiment contact plug structure of FIG. 7G having the capacitor electrode formed in contact withly with the neck portion of the contact plug.

DETAILED DESCRIPTION OF THE PREFERRED AND ALTERNATE EMBODIMENTS

The present invention provides a multi-diameter electrical conductor for use in a microelectronic structure and a method for forming such conductor. The conductor can be formed with either a body portion and a neck portion, or can be formed with a body portion and two or more neck portions by additional processing steps. In a most likely embodiment, a dual-diameter electrical conductor is formed by a body portion that has a larger diameter and a neck portion that has a smaller diameter.

Figure 1:
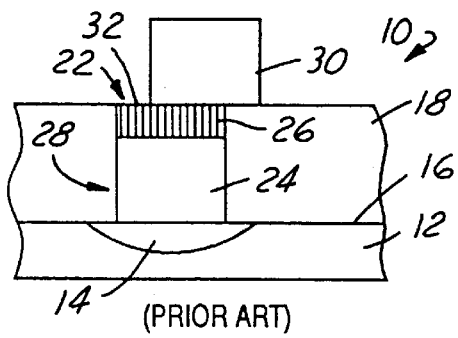
FIG. 1 is an enlarged, cross-sectional view of a conventional microelectronic structure showing a stacked capacitor electrode only partially overlapping a contact plug formed in a dielectric layer.
Figure 2:
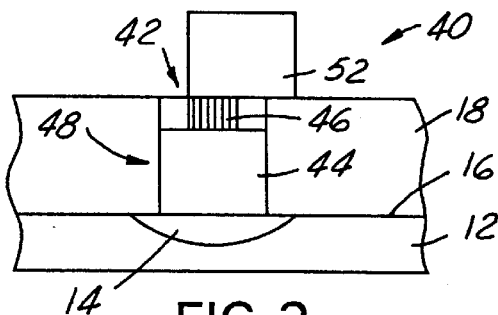
FIG. 2 is an enlarged, cross-sectional view of a present invention preferred embodiment showing a reduced-dimension neck portion of the contact plug being completely overlapped by a misaligned stacked electrode.

Referring initially to FIG. 2, wherein a present invention microelectronic structure 40 is shown. The microelectronic structure 40 consists of a semi-conducting substrate 12 having an active circuit element 14 formed in a top surface 16. Into a first dielectric material layer 18, such as a layer formed of $SiO_2$, a contact hole 42 is formed by a reactive ion etching process, and then filled with a first conductive material 44 and a second conductive material 46 forming the contact plug 48. The formation of the body portion 44 by the first conductive material and the formation of the neck portion 46 by the second conductive material shall be described in detail in a later section. A stacked electrode 52 for a stacked capacitor (not shown) is then formed to completely overlap the top of the neck portion 46 of the contact plug 48. When compared to a conventional structure shown in FIG. 1, the advantages of the present invention become apparent in that when the same size capacitor electrode is formed on top of the contact plug, the off-set of the electrode due to misalignment does not prevent the electrode from completely overlapping the contact plug in the present invention novel structure.

The present invention relates to the geometry of conductive plug or via structures that are used for electrically connecting conductive elements in microelectronic devices such as high density DRAM's where, for example, the conductive elements to be connected may include the stacked capacitor electrodes and the underlying circuit elements. In particular, the present invention relates to structures and fabrication techniques for a class of misalignment-tolerant contact plugs that have a dual-diameter geometry in which plug surfaces contacting misalignment-intolerant features may be reduced to sub-minimum lithography dimensions by means of sidewall spacers.

The dual-diameter contact plug structure of the present invention is embedded in a dielectric layer. The contact plug has a lower or body portion that has a lithographically designed diameter, and an upper or neck portion that has a diameter smaller than the lithographically defined diameter of the body portion. In a preferred embodiment, body portion diameter matches the minimum lithography dimension, while the neck portion diameter has a sub-minimum lithography dimension. The neck portion of the contact plug is fabricated by first coating insulating sidewall spacers on the upper portion of the dielectric cavity in which the contact plug body portion is formed, and then filling an opening formed by the sidewall spacers with a conductive material.

Figure 3A:
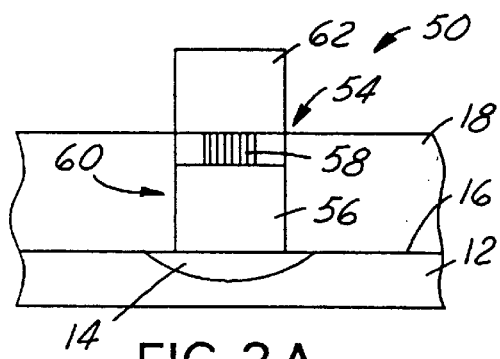
FIG. 3A is an enlarged, cross-sectional view of the present invention preferred embodiment showing a reduced-dimension neck portion of the contact plug being completely overlapped by an aligned stacked electrode.

FIGS. 3A~3D illustrate four of the many possible embodiments of the present invention. FIG. 3A illustrates a preferred embodiment of the present invention microelectronic structure 50. The microelectronic structure 50 consists of a semi-conducting substrate 12, and an active circuit element 14 formed in a top surface 16 of the substrate. In a first dielectric material layer 18, a contact hole 54 is formed and then subsequently filled with a first conductive material forming a body portion 56 and a second conductive material forming a neck portion 58 for the contact plug 60. A conductive electrode 62 is then deposited and formed on top of the microelectronic structure 50. As shown in FIG. 3A, the conductive material used to form the neck portion 58 and the conductive material used to form the electrode 62 are different. The details for formation of this preferred embodiment structure is given below in Example 1.

Figure 3B:
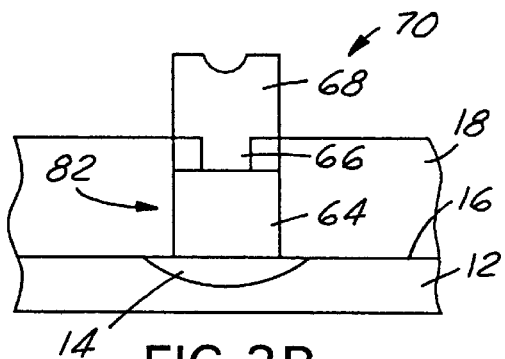
FIG. 3B is an enlarged, cross-sectional view of an alternate embodiment of the present invention novel structure.

FIG. 3B illustrates an alternate embodiment of the present invention microelectronic structure 70. In this alternate embodiment, on top of a body portion 64, a neck portion 66 and a capacitor electrode 68 are formed by the same conductive material in a single deposition and forming process. The details for formation of this embodiment is given below in Example 2.

Figure 3C:
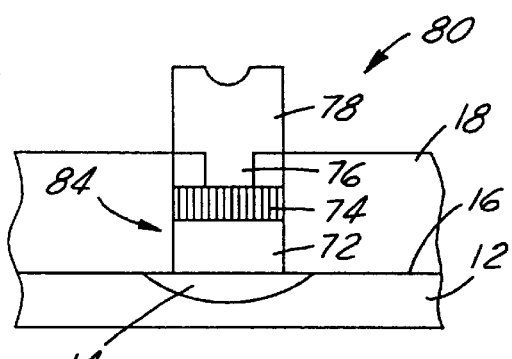
FIG. 3C is an enlarged, cross-sectional view of a second alternate embodiment of the present invention novel structure incorporating the use of an additional conductive material layer.

FIG. 3C illustrates a second alternate embodiment of the present invention contact plug in a microelectronic structure 80. It is seen that on top of a body portion 72 of the contact plug 84, an additional conductive material layer 74 is first deposited and formed prior to the deposition and forming of the neck portion 76 and the capacitor electrode 78. A contact plug 84 is thus formed with the additional layer of conductive material 74 sandwiched between the neck portion 76 and the body portion 72. Detail processing steps for forming the second alternate embodiment contact plug are shown below in Example 3.

Figure 3D:
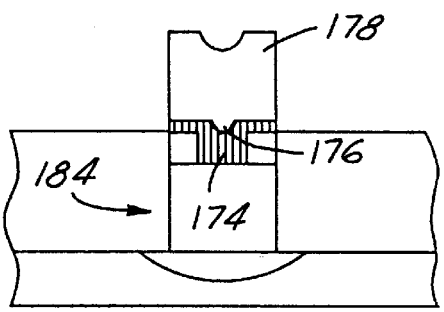
FIG. 3D is an enlarged, cross-sectional view of a third alternate embodiment of the present invention novel structure incorporating the use of an additional conductive material layer.

FIG. 3D illustrates a third alternate embodiment of the present invention contact plug in a microelectronic structure 85. Note that the embodiments of FIGS. 3C and 3D differ by the fact that in FIG. 3C the additional conductive layer 74 is below the neck portion 76 of contact plus the material for the neck portion 176 of contact plug 184 and is integral with capacitor electrode 178.

The materials used in forming the neck portions 58 and 176 and the additional conductive layer 74 are preferably barriers to plug material diffusion, electrode material diffusion and/or oxygen diffusion. It should be noted that in FIGS. 3A~3D, the active circuit element 14 and the stacked electrodes 62, 68, 78, 178 and are merely given as examples of two conductive elements which may be electrically connected by the present invention novel contact plug. The present invention novel contact plug can be utilized equally well in providing electrical communications between any other two conductive elements than those shown in the various embodiments.

The conductive materials utilized in forming the neck portion and the body portion of the contact plug may be the same or may be different. The materials are typically selected from the groups of conductive materials which include doped polysilicon, refractory metals such as tungsten, silicides, low resistivity metals such as Al, Al—Cu, Cu, Cu alloys, noble metals and their alloys, metallic diffusion barrier materials such as Ta and W, and oxide and nitride diffusion barrier materials such as TiN, TaSiN, TiAlN, WN, TaN and WSi, adhesion layers such as Ti, and alloys or mixtures of these materials, alone or in layered combinations. Each of the three embodiments shown in FIGS. 3A~3D has its own advantages and disadvantages. For example, the preferred embodiment of FIG. 3A has the advantage of simplicity, but may fail if the materials of the capacitor electrode 62 and the body portion 56 interdiffuse during processing. However, all four embodiments of the dual-diameter contact plugs have the diameter of the plug body portion equal to the minimum lithography dimension and the diameter of the plug neck portion smaller than the minimum lithography dimension.

Figure 4:
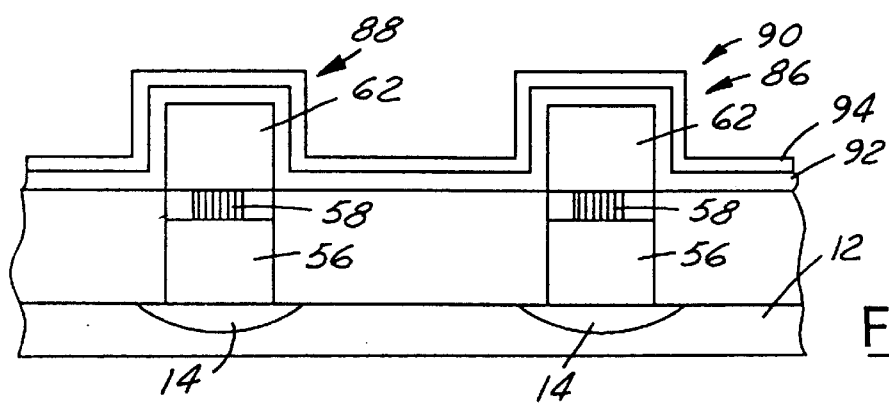
FIG. 4 is an enlarged, cross-sectional view of the present invention preferred embodiment contact plug structure with completed stacked capacitors formed on top.

FIG. 4 illustrates a microelectronic structure 90 which has two completed capacitor structures 86 and 88 incorporating the dual-diameter contact plug structure illustrated in the preferred embodiment of the present invention (shown in FIG. 3A). The capacitors of FIG. 4 contain a conformally deposited layer 92 of a ferroelectric or capacitor dielectric layer on the bottom (or stacked) electrodes 62, and a counterelectrode (or plate electrode) 94. The bottom electrodes 62 are electrically connected to conductive substrate regions 14 by means of plug body portions 56 and plug neck portions 58.

EXAMPLE 1

Figure 5A:
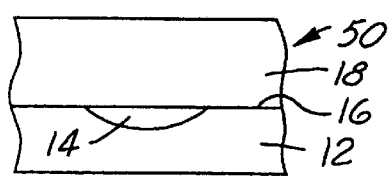
FIG. 5A is an enlarged, cross-sectional view of a substrate and a dielectric layer for forming the present invention preferred embodiment structure.
Figure 5B:
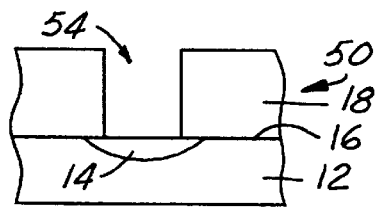
FIG. 5B is an enlarged, cross-sectional view of the present invention preferred embodiment structure of FIG. 5A having a contact hole formed on top of the circuit element in the substrate.
Figure 5C:
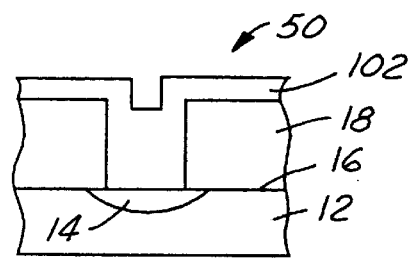
FIG. 5C is an enlarged, cross-sectional view of the present invention preferred embodiment contact plug structure of FIG. 5B having a conductive material filling the contact hole.
Figure 5D:
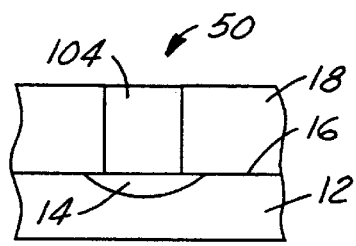
FIG. 5D is an enlarged, cross-sectional view of the present invention preferred embodiment contact plug structure of FIG. 5C having the contact plug formed.
Figure 5E:
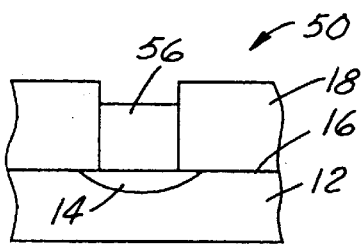
FIG. 5E is an enlarged, cross-sectional view of the present invention preferred embodiment contact plug structure of FIG. 5D having a top layer of the contact plug removed by a selective etching process.
Figure 5F:
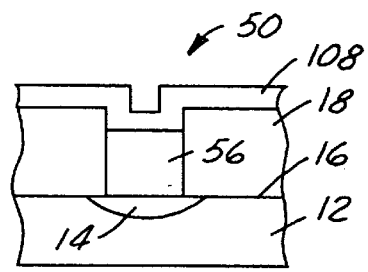
FIG. 5F is an enlarged, cross-sectional view of the present invention preferred embodiment contact plug of FIG. 5E having a second dielectric material deposited into the contact hole.
Figure 5G:
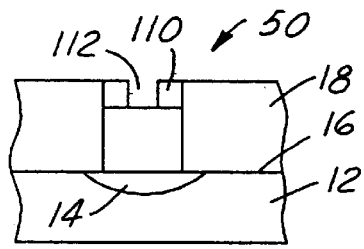
FIG. 5G is an enlarged, cross-sectional view of the present invention preferred embodiment contact plug structure of FIG. 5F having sidewall spacers formed inside the contact hole.
Figure 5H:
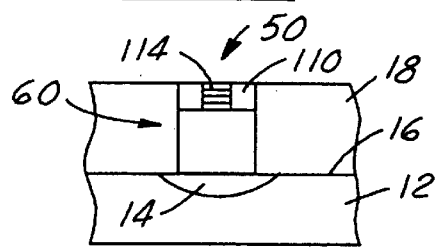
FIG. 5H is an enlarged, cross-sectional view of the present invention preferred embodiment contact plug structure of FIG. 5G having a second conductive material deposited into the opening formed by the sidewall spacers forming a neck portion of the plug.
Figure 5I:
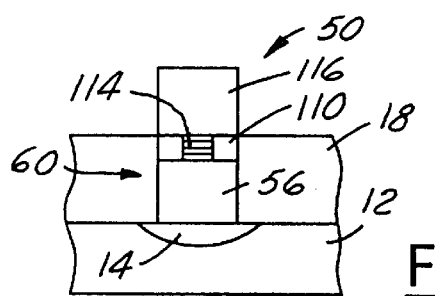
FIG. 5I is an enlarged, cross-sectional view of the present invention preferred embodiment contact plug structure of FIG. 5H having a capacitor electrode formed on top of the neck portion of the contact plug.

Example 1 illustrates the processing steps for forming the present invention preferred embodiment contact plug of FIG. 3A in FIGS. 5A–5I. FIG. 5A is an enlarged, cross-sectional view of an electronic structure 50 having a first dielectric material layer 18 deposited on a top surface 16 of a semi-conducting substrate 12 covering the conductive substrate region 14. A typical dielectric material used is $SiO_2$. A contact via hole 54 is then etched by a reaction ion etching technique in the first dielectric material layer 18 as shown in FIG. 5B. The contact via hole 54 is then overfilled with a conductive plug material 102 as shown in FIG. 5C. The conductive plug material layer 102 can be planarized by a process such as chemical mechanical polishing (CMP) for forming a contact plug 104. This is shown in FIG. 5D. The plug structure is then recessed, as shown in FIG. 5E, by a selective etching technique such as reactive ion etching by utilizing an etch chemistry that has a large etch selectivity ratio between a dielectric layer of $SiO_2$ and a conductive material layer of doped polysilicon. An etch process by using $SF_6$ or other fluorine-based gases is capable of producing an etch selectivity ratio of about 50:1 between doped polysilicon and $SiO_2$. Any other etch gas that is capable of producing an etch rate ratio of more than 5:1 can be suitably used in the present invention novel method for forming the contact plugs. In the next step of the process, a layer of a second dielectric material 108 is conformally deposited on top of the electronic structure 50, as shown in FIG. 5F. The second dielectric material layer 108 is then anisotropically etched in a reactive ion etching process to form sidewall spacers 110. This is shown in FIG. 5G. A third conductive material is then deposited into opening 112 formed by the sidewall spacers 110 to form a neck portion 114 of the contact plug 60. This is shown in FIG. 5H. The neck portion 113 can be formed after a deposition process and a planarization process are conducted on the third conductive material. In a final step of the process, an electrode material 116 is deposited and patterned to produce the structure shown in FIG. 5I.

EXAMPLE 2

An alternate embodiment of the present invention contact plug is shown in FIGS. 6A and 6B in enlarged, cross-sectional views. The structure 70 produced is similar to that previously shown in FIG. 3B. The formation of the alternate embodiment of the present invention contact plug is illustrated starting from a structure similar to that shown in FIG. 5G. Into an opening 112 formed by sidewall spacers 110, a layer of electrode material 120 is deposited on top of the microelectronic structure 70. The electrode layer 120 is patterned to then form the capacitor electrode 68 as shown in FIG. 6B. The neck portion 66 of the contact plug 82 corresponds to the part of the electrode material 120 that also functions as the plug neck portion.

EXAMPLE 3

A second alternate embodiment of the present invention novel contact plug of FIG. 3C and one method of its formation process are shown in FIGS. 7A–7H. For instance, FIG. 7A is an enlarged, cross-sectional view of a microelectronic structure 80 in a similar processing state as that shown in FIG. 5E. A plug body portion 72 is first formed and recessed by a selective etch process forming an opening 122. A conductive (or conductive barrier) material layer 124 is then deposited on top of the microelectronic structure 80 as shown in FIG. 7B. The conductive material layer 124 is then planarized by a process such as a chemical mechanical polishing method forming a conductive plug body cap 126 on top of the body portion 72 for the contact plug. This is shown in FIG. 7C. The conductive plug body cap 126 is then recessed in a selective etching process to form an opening 128 with exposed sidewall surface 130. On top of the exposed sidewall surface 130, sidewall spacers 134 are formed by first depositing a dielectric layer 132 into opening 128 on top of the microelectronic structure 80. These steps are shown in FIGS. 7D, 7E and 7F. A layer of an electrode material 142 is then deposited into opening 138 and on top of the microelectronic structure 80, as shown in FIG. 7G. After the electrode material layer 142 is patterned, a capacitor electrode 78 is formed for as providing electrical communication with the neck portion 76, the conductive region 126 and the body portion 72 of the contact plug 84. Similar to the embodiment shown in FIG. 6B, the electrode portion 76 corresponds to the part of the electrode material 142 that doubles as the plug neck portion.

An alternate route from the structure of FIG. 7A to the structure of FIG. 7D might comprise the step of directly forming conductive plug cap 126 by a process such as selective chemical vapor deposition. Self-aligned silicide formation may also be used to form the plug body cap layer 126 if plug body cap layer 126 is a metal silicide and plug body material is silicon or silicon-contributing. Self-aligned silicide formation would comprise the steps of depositing a metal layer on the structure of FIG. 7A, heating in such a manner as to locally cause the metal over the plug to form a metal silicide, and then selectively etching unreacted metal remaining over the non-plug regions of the substrate.

The present invention has therefore been amply demonstrated in three different embodiments shown in FIGS. 2–7H. The present invention provides a novel structure and a novel fabrication method for a class of misalignment-tolerant contact plugs that have a dual-diameter geometry. The plug surfaces which contact misalignment-intolerant features may be reduced to sub-minimum lithography dimensions by means of sidewall spacers. By utilizing the dual-diameter plug geometry, it is possible for the plug to have the minimum lithography diameter over most of its length, but a sub-minimum lithography dimensions on its critical contact surfaces. Such a plug could be suitably used, for example, to connect conductive device elements in a substrate to a DRAM stacked electrode whose diameter would not have to be any wider than the minimum lithography dimension used for the widest portion of the contact plug.

The novel conductive plug structure of the present invention is typically surrounded on its sides by a dielectric material. The lower (or body) portion of the plug has a lithographically designed diameter, and is surrounded and contacted on its sides by a first dielectric material. The lower body portion would typically be formed by forming a cavity in a layer of first dielectric material and then partially filling the cavity with a plug body material. The upper (or neck) portion of the plug has a diameter smaller than the lithographically designed diameter of the plug body, and is surrounded and contacted on its sides by a second dielectric material. The neck portion of the plug structure is provided by coating insulating sidewall spacers of the second dielectric material on the unfilled portion of the cavity in the first dielectric in which the plug body is situated, and then filling the opening formed by the sidewall spacers with the conductive material of the plug neck portion.

The first and second dielectric materials may be the same or different, and would typically be selected from the groups of insulating oxides and nitrides such as $SiO_2$ and silicon nitride. The first dielectric may also comprise one or more layers of two or more different dielectrics, such as a layer of silicon nitride sandwiched between upper and lower layers of $SiO_2$.

The narrow diameter section of the contact plug has been called the neck portion of the plug, while the wider portion of the plug has been called the body portion of the plug. The neck portion of the plug may also be viewed as a plug extension. The neck porterial, or from a mixture, alloy, of two or more materials, or layered combination. In addition, the neck portion of the plug may be formed at the bottom of the plug, all along the plug or at both top and bottom portions of the plug.

While the present invention has been described in an illustrative manner, it should be understood that the terminology used is intended to be in a nature of words of description rather than of limitation.

Furthermore, while the present invention has been described in terms of a preferred embodiment and two alternate embodiments, it is to be appreciated that those skilled in the art will readily apply these teachings to other possible variations of the inventions.

The embodiment of the invention in which an exclusive property or privilege is claimed are defined as follows:

1. A method for fabricating a dual-diameter electrical conductor comprising the steps of:
   providing a substrate having a first conductive region formed of a first conductive material,
   depositing a layer of a first dielectric material on said substrate,
   etching a first opening in said first dielectric material layer by reactive ion etching to expose said first conductive region in the substrate,
   depositing a second conductive material into said first opening in said first dielectric material layer forming a body portion of the conductor,
   removing a surface layer of said second conductive material to at least partially expose an upper sidewall surface in said first opening,
   forming sidewall spacers of a second dielectric material on said upper sidewall surface of said first opening thereby defining a second opening through which said body portion of the conductor is exposed, and
   depositing a third conductive material into said second opening and forming a neck portion of the conductor that is in contact with the body portion of said conductor, said neck portion having a diameter at a top surface of the neck portion smaller than a diameter of said body portion.

2. A method for fabricating a dual-diameter electrical conductor according to claim 1, wherein said first opening formed in said first dielectric material layer is a contact hole that at least partially exposes said first conductive region in said substrate.

3. A method for fabricating a dual-diameter electrical conductor according to claim 1 further comprising the steps of depositing and forming a stacked capacitor electrode on top of and in electrical communication with the neck portion of said electrical conductor.

4. A method for fabricating a dual-diameter electrical conductor according to claim 1, wherein said surface of the second conductive material layer being etched away to a level below the top surface of said first opening such that an upper sidewall surface in the first opening is re-exposed.

5. A method for fabricating a dual-diameter electrical conductor according to claim 1, wherein said sidewall spacers of a second dielectric material are formed by a conformal deposition technique followed by an anisotropic etching process.

6. A method for fabricating a dual-diameter electrical conductor according to claim 1, wherein said second opening defined by said sidewall spacers formed in said first opening being smaller than said first opening and thus allowing the formation of a neck portion of the electrical conductor smaller than the body portion of the conductor.

7. A method for fabricating a dual-diameter electrical conductor comprising the steps of:
   providing a substrate having a first conductive region formed or a first conductive material,
   depositing a layer of a first dielectric material on said substrate,
   etching a first opening in said first dielectric material layer to expose said first conductive region in the substrate,
   depositing a second conductive material into said first opening in said first dielectric material layer forming a body portion of the conductor,
   removing a surface layer of said second conductive material to at least partially expose an upper sidewall surface in said first opening,
   forming sidewall spacers of a second dielectric material on said upper sidewall surface of said first opening thereby defining a second opening through which said body portion of the conductor is exposed,
   depositing a third conductive material into said second opening and forming a neck portion of the conductor that is in contact with the body portion of said conductor, said neck portion having a diameter at a top surface of the neck portion smaller than a diameter of said body portion, and
   depositing and forming a stacked capacitor electrode on top of and in electrical communication with said neck portion of said electrical conductor.

8. A method for fabricating a dual-diameter electrical conductor according to claim 7, wherein said first opening in said first dielectric material layer is formed by a reactive ion etching method.

9. A method for fabricating a dual-diameter electrical conductor according to claim 7, wherein said first opening formed in said first dielectric material layer is a contact hole that at least partially exposes said first conductive region in said substrate.

10. A method for fabricating a dual-diameter electrical conductor according to claim 7, wherein said surface of the second conductive material layer being etched away to a level below the top surface of said first opening such that an upper sidewall surface in the first opening is re-exposed.

11. A method for fabricating a dual-diameter electrical conductor according to claim 7, wherein said sidewall spacers of a second dielectric material are formed by a conformal deposition technique followed by an anisotropic etching process.

12. A method for fabricating a dual-diameter electrical conductor according to claim 7, wherein said second opening defined by said sidewall spacers formed in said first opening being smaller than said first opening and thus, allowing the formation of a neck portion of the electrical conductor smaller than the body portion of the conductor.

\* \* \* \* \*